United States Patent
Lukas et al.

(10) Patent No.: US 6,895,700 B2
(45) Date of Patent: May 24, 2005

(54) PRESSING IRON SOLEPLATE HAVING A HARDENED AND COATED SURFACE

(75) Inventors: Andrea Lukas, Offenbach (DE); Matthias Hahn, Frankfurt (DE)

(73) Assignee: Rowenta Werke GmbH, Offenbach (DE)

( * ) Notice: Subject to any disclaimer, the term of this patent is extended or adjusted under 35 U.S.C. 154(b) by 132 days.

(21) Appl. No.: 10/386,926

(22) Filed: Mar. 13, 2003

(65) Prior Publication Data

US 2003/0177672 A1 Sep. 25, 2003

(30) Foreign Application Priority Data

Mar. 13, 2002 (FR) ............................................ 02 03124

(51) Int. Cl.[7] ............................................. D06F 75/38
(52) U.S. Cl. ...................................................... 38/93
(58) Field of Search ............................... 38/74, 80, 81, 38/88, 93, 97; 72/53, 76; 29/527.2, 527.4; 148/549, 552

(56) References Cited

U.S. PATENT DOCUMENTS

| | | | |
|---|---|---|---|
| 1,205,185 A | * | 11/1916 | Freeman ...................... 38/141 |
| 2,750,691 A | * | 6/1956 | Parr ............................. 38/77.9 |
| 3,099,869 A | | 8/1963 | Piper |
| 4,862,609 A | * | 9/1989 | Ullrich et al. .................. 38/93 |
| 5,105,525 A | * | 4/1992 | Firatli et al. ................ 29/527.3 |
| 5,503,688 A | * | 4/1996 | Arnaud et al. .............. 148/534 |
| 5,943,799 A | | 8/1999 | Xu et al. |
| 6,000,157 A | * | 12/1999 | De Beurs et al. ................ 38/93 |
| 6,446,371 B2 | * | 9/2002 | Wehrwein ........................ 38/93 |

FOREIGN PATENT DOCUMENTS

| | | | |
|---|---|---|---|
| EP | 0 640 714 | | 3/1995 |
| EP | 0726351 A | * | 10/1995 |
| FR | 2803310 | | 7/2001 |

* cited by examiner

*Primary Examiner*—Ismael Izaguirre
(74) *Attorney, Agent, or Firm*—Browdy and Neimark, P.L.L.C.

(57) ABSTRACT

A soleplate for a clothes pressing iron, composed of: a metal sheet having a lower surface that will be directed toward fabrics to be ironed, a lower surface layer that extends form the lower surface and an interior region that is separated from the lower surface by the lower surface layer, the lower surface layer being mechanically hammer-hardened, or work hardened, to have a hardness greater than the hardness of the sheet prior to being mechanically hardened; and a coating that is hard and resistant to scratching covering the lower surface.

20 Claims, 1 Drawing Sheet

PRESSING IRON SOLEPLATE HAVING A HARDENED AND COATED SURFACE

BACKGROUND OF THE INVENTION

The present invention concerns soleplates for clothes pressing irons.

It is known that the soleplates of pressing irons should have a pressing surface that slides easily on fabrics, but should also resist stresses, attacks provoked by an overly vigorous cleaning or rubbing of the soleplate on hard components of clothing, such as zippers, hooks, or buttons.

In order to resist these stresses, which are capable of creating scratches that will reduce the sliding performance of the soleplate, efforts have been made to harden the ironing surface of the soleplate.

French patent FR 2581402 thus describes an enameled aluminum soleplate, which has the drawback that application of the enamel requires production means that are substantial and costly.

It is also known to harden surfaces by mechanical treatment, for example by impacting such surfaces with shot or microbeads as described in the patent FR 2803310, but this treatment can be insufficient to enable the treated surface to withstand the strongest attacks.

Another hardening procedure consists in depositing on the surface to be treated a hard coating by a sol-gel process, as described in the patent EP 0640714. Such a coating is thin, highly resistant in and of itself to attack, and economical to produce. However, the metal support of the coating being ductile, the coating can be dented and can deteriorate.

The patent WO 9813544 describes an iron having an aluminum soleplate plate that includes an anti-friction coating containing an inorganic polymer. The anti-friction coating is deposited on an intermediate hard coating that is harder than aluminum. However, the provision of this intermediate coating adds significantly to the cost of manufacturing the soleplate.

BRIEF DESCRIPTION OF THE INVENTION

The present invention provides a pressing iron soleplate that is improved by the deposition of a hard scratch resistant coating on the ironing surface, but does not have the disadvantages discussed above.

For this purpose, the invention provides a pressing iron metal soleplate which is treated at the surface that will be in contact with fabrics by a mechanical hammer-hardening, or work hardening treatment, a treatment that is noteworthy in that the ironing surface is, in addition, covered by a coating that is hard and resistant to scratching.

The metal constituting the soleplate, generally an aluminum alloy or stainless steel, is normally relatively soft. A hard, thin coating placed in this support does not resist shocks. The coating can be pressed into the metal and deforms to retain a residual impression of the impact. The present invention provides a significant improvement in this regard in that the preliminary mechanical hammer-hardening treatment causes the soleplate to resist denting of the surface by shocks or impacts experienced by the iron on hard, projecting bodies, which permits the coating deposited on the surface to resist deformation without flaking or chipping away.

Preferably the mechanical hammer-hardening treatment is a treatment with microbeads or shot.

The treatment is carried out not to effect only a simple cleaning of the surface, but to modify the surface to a certain depth without any notable abrasive effect.

Multiple shocks produced by impacting beads of shot on the metal surface results in a hammer-hardening that increases the hardness of the metal surface. The impacts, being multiple and close to one another, do not adversely affect the evenness of the surface, which assumes a matte appearance.

The coating deposited on the surface can be an electrolytic coating such as a hard chrome plating, or a metal coating formed by chemical deposition, or plasma deposition, or vapor deposition under a vacuum, or any other deposition producing a coating that improves the ironing surface.

According to one possibility, the hard coating resistant to scratching is a chemically deposited nickel coating.

Advantageously, the soleplate coated with nickel is heated to a temperature of the order of 230° C. for several hours.

This thermal treatment at a temperature lower than the annealing temperature of the soleplate produces a hardening of the coating.

In another version, the hard scratch-resistant coating is a ceramic layer obtained by a physical vapor deposition (PVD) process.

A PVD process permits a large variety of deposits to be produced. In addition to a simple metallization, for example with nickel or chromium, the most well known deposits appropriate for ironing soleplates are nitride or carbonitride of titanium, aluminum-titanium nitride, chromium nitride, or zirconium nitride.

Preferably, the ceramic deposit is a layer of chromium nitride.

This deposit is easily sufficiently hard for use on an ironing surface, has a very good resistance to chemical agents and abrasion, a lower degree of roughness than titanium nitride, and a good coefficient of sliding friction.

Preferably, the hard scratch-resistant coating is a coating comprising an inorganic chemical structure deposited by any suitable, known sol-gel process.

Numerous known processes, for example, from the patents owned by companies such as Datec, or INM or Protavic, permit a scratch resistant coating to be obtained on a metal part by a sol-gel process. These economical processes permit the production of hard coatings that are highly adherent and whose structure is based on a network having inorganic mineral bonds. Coatings that are resistant to scratching and that present a smooth surface permit easy sliding on fabrics. These processes generally include a phase of placing an organo-metallic precursor into solution, a hydrolysis phase, and, after spreading on the surface to the covered, a baking phase that can be at relatively low temperature.

Preferably a sol-gel process is selected to obtain a hard scratch-resistant coating on the sole plate with process temperatures that are below the annealing temperature of the underlying metal and that preserve the hardness of the hardened surface.

An excessively high temperature, close to or greater than the annealing temperature, would relax the internal strains of the hardened metal and could lead to deformation of the soleplate. In addition, an excessively high temperature would lead to an enlarging of the metal grains and would reduce the hardness by counteracting the hardening treatment.

For aluminum soleplates, depending on the alloy selected, the annealing temperature would be in the range of 325° C. to more than 400° C. To obtain a suitable coating, one would choose a process that does not require very high baking temperatures, for example that described in U.S. Pat. No. 5,644,014. Soleplates of stainless are annealed at higher temperatures, which increases the possibilities for the choices of processes and the coatings that can be obtained. Preferably, the constituent metal of the soleplate is stainless steel or an aluminum alloy.

DETAILED DESCRIPTION OF THE INVENTION

Figure 1:
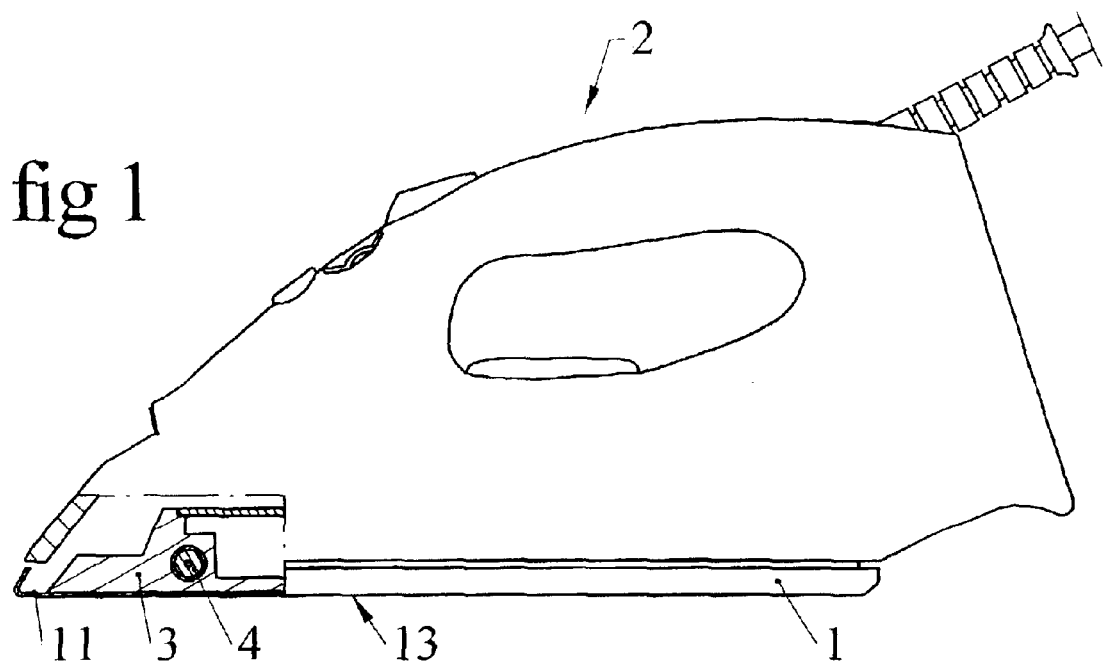
FIG. 1 is a side elevational view, partially in cross section, of a clothes pressing iron equipped with a soleplate according to the present invention.
Figure 2:
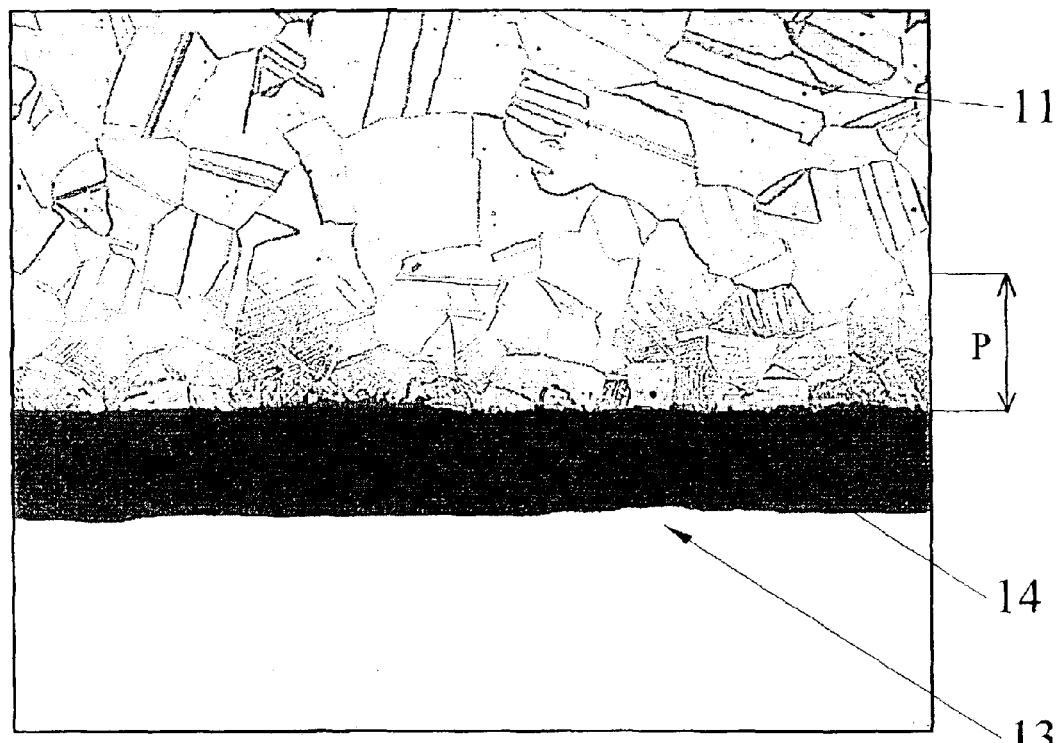
FIG. 2 is a reproduction of a microphotograph of the soleplate of FIG. 1 in the vicinity of its ironing surface.

Referring to FIG. 1, according to one preferred embodiment of the invention, which is illustrated, the soleplate 1 of a pressing iron 2 is essentially composed of a stainless steel sheet 11 whose thickness can be between 0.4 and 1.5 mm. Soleplate 1 is heated by a heating block 3, which may be made of aluminum, and into which is overmolded a conventional heating element 4. An iron according to the invention can be a steam iron or a dry iron.

Stainless steel sheet 11 is covered on it ironing surface 13 with a hard scratch-resistant coating 14.

Coating 14 adheres securely to surface 13 of sheet 11. In accordance with a further feature of the present invention, surface 13 is preliminarily subjected to a mechanical treatment, similar that described in French patent 2803310, involving impacting essentially nonabrasive particles onto the surface.

The crystalline structure of sheet 11 is modified at surface 13 by the mechanical treatment, essentially to a depth P that is preferably between 25 and 35 microns from the ironing surface. This modification substantially increases the strength and hardness of sheet 11 at surface 13.

Preferably, the surface of sheet 11 that is covered by coating 14 has grains that have been deformed by compression in a direction perpendicular to the surface, the number of metal dislocations per unit of volume being 40% greater than that in the metal within sheet 11 at locations that have not been affected by the hardening treatment.

Preferably, the Vickers hardness of surface 13 of sheet 11 is at least 25% greater than that measured within sheet 11 at locations remote from the surface.

According to a first embodiment, coating 14 has a structure with an inorganic base comprising chemical chain bonds, which metals such as silicon, zirconium, titanium, and aluminum for example can produce essentially with oxygen.

Fabrication of the coating is preferably in accordance with the description in U.S. Pat. No. 5,644,014. In effect, the coatings that can be produced with these means have desirable qualities for an ironing soleplate. In particular they are mechanically more resistant to scratching than the metals that they cover. Being anti-adhesive, they facilitate sliding of the iron on the fabrics.

In addition, the baking, or curing, temperatures are relatively low, preferably of the order of 90° C. to 350° C., and more preferably around 180° C., which avoids heating sheet 11 to a temperature that could relax the internal strains in the metal that result from the hardening treatment. In particular, a temperature is selected that would preserve the size of the deformed metal grains and the hardening, as well as the basic shape of the part.

As a result, coating 14 can be very thin, for example with a thickness less than 10 microns. A shock applied to this coating is transmitted to the hardened metal, which can safely resist shocks of substantial magnitude. The coating will then not be deformed or break.

In addition, the resulting coating is essentially transparent, which preserves the metallic appearance presented by a stainless steel sheet.

According to another embodiment of the invention, which is quite satisfactory in combination with the exterior hammer hardening of sheet 11, coating 14 can be composed of chromium nitride deposited by a PVD process. Chromium nitride has a hardness of the order of three times that of stainless steel. After mechanical hardening, the iron soleplate is placed in an enclosure at low pressure. Ions produced by electron bombardment of one or several targets of conductive material, preferably of chrome, are transported in the form of a ionized gas onto the surface of the soleplate and condense thereon. Over their travel path, the ions can react with low pressure gas in the enclosure, preferably nitrogen, and can be combined therewith, to produce, preferably, a very hard layer of chromium nitride on the soleplate. This process does not produce any heating, and thus does not destroy the hardening the soleplate.

The hammer-hardened soleplate can also be clad by PVD deposition of pure metals or alloys. However, it is preferable to select the coating from among ceramic compounds such as nitrides of chromium, titanium, zirconium, or zirconium and aluminum, and titanium carbonitride, whose hardnesses are approximately the same as or greater than that of chromium nitride.

A very hard nitride layer, the thickness of which is of the order of 1 to 5 microns, is sufficient to give the soleplate an excellent resistance to scratching. The layer, supported by a hardened metal, will not break when exposed to localized stresses such as those produced by an impact of the iron on a zipper or a button of a garment.

By these means, there is obtained a pressing iron soleplate that slides easily during ironing and is insensitive to scratching.

The embodiment of FIG. 1 can also be constructed with sheet 11 made of aluminum, which is hammer-hardened, and a coating 13 that can be applied at process temperatures that will not relax the hardened structure of the aluminum. In addition, suitable coating, or cladding, processes other than the sol-gel process may be employed.

This application relates to subject matter disclosed in French Application Number FR 0203124, filed on Mar. 13, 2002, the disclosure of which is incorporated herein by reference.

The foregoing description of the specific embodiments will so fully reveal the general nature of the invention that others can, by applying current knowledge, readily modify and/or adapt for various applications such specific embodiments without undue experimentation and without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. The means, materials, and steps for carrying out various disclosed functions may take a variety of alternative forms without departing from the invention.

Thus the expressions "means to . . . " and "means for . . . ", or any method step language, as may be found in the specification above and/or in the claims below, followed by a functional statement, are intended to define and cover whatever structural, physical, chemical or electrical element or structure, or whatever method step, which may now or in the future exist which carries out the recited function, whether or not precisely equivalent to the embodiment or embodiments disclosed in the specification above, i.e., other means or steps for carrying out the same functions can be used; and it is intended that such expressions be given their broadest interpretation.

What is claimed is:

1. A soleplate for a clothes pressing iron, comprising:
  a metal sheet having a lower surface that will be directed toward fabrics to be ironed, a lower surface layer that extends from said lower surface and an interior region that is separated from said lower surface by said lower surface layer, said lower surface layer being mechanically hammer-hardened, or work hardened, to have a hardness greater than the hardness of said sheet prior to being mechanically hardened; and
  a coating that is hard and resistant to scratching covering said lower surface.

2. The soleplate of claim 1, wherein said lower surface is mechanically hammer-hardened, or work hardened, by a treatment with microbeads or shot.

3. The soleplate of claim 2, wherein said surface layer of said sheet contains grains that have been deformed by compression in a direction perpendicular to said lower surface, with a number of metal dislocations per unit of volume that is 40% greater than the number of metal dislocations per unit of volume within said interior region.

4. The soleplate of claim 2, wherein said lower surface layer that is mechanically hardened has a thickness that is between about 25 and 35 microns.

5. The soleplate of claim 1, wherein said coating is deposited on said lower surface of said sheet by a sol-gel process.

6. The soleplate of claim 5, wherein the sol-gel process is carried out with process temperatures that are below the annealing temperature of the metal constituting said sheet to preserve the hardness of said lower surface layer.

7. The soleplate of claim 6, wherein said coating has a thickness not greater than 10 microns.

8. The soleplate of claim 6, wherein said coating is transparent.

9. The soleplate of claim 1, wherein said coating is composed of nickel that is chemically deposited on said lower surface.

10. The soleplate of claim 9, wherein the soleplate coated with nickel is heated to a temperature of the order of 230° C. for several hours.

11. The soleplate of claim 1, wherein said coating is constituted by a ceramic layer formed by a physical vapor deposition process.

12. The soleplate of claim 11, wherein said ceramic layer consists of chromium nitride.

13. The soleplate of claim 1, wherein said metal sheet is made of stainless steel or an aluminum alloy.

14. A method of making a soleplate for a clothes pressing iron, comprising:
  providing a metal sheet having a lower surface that will be directed toward fabrics to be ironed, a lower surface layer that extends form said lower surface and an interior region that is separated from said lower surface by said lower surface layer;
  mechanically hammer-hardening, or work hardening, said lower surface layer to have a hardness greater than the hardness of said sheet prior to being mechanically hardened; and
  applying a coating that is hard and resistant to scratching to said lower surface.

15. The process of claim 14, wherein said hardening comprises impacting said lower surface with microbeads or shot.

16. The process of claim 15, wherein said hardening is carried out to deform metal grains in said surface layer by compression in a direction perpendicular to said lower surface, with a number of metal dislocations per unit of volume that is 40% greater than the number of metal dislocations per unit of volume within said interior region.

17. The process of claim 14, wherein said step of applying a coating is carried out by a sol-gel process.

18. The process of claim 17, wherein the sol-gel process is carried out with process temperatures that are below the annealing temperature of the metal constituting said sheet to preserve the hardness of said lower surface layer.

19. The process of claim 14, wherein said step of applying a coating comprises chemically depositing a nickel layer on said lower surface, or forming a ceramic layer on said lower surface by a physical vapor deposition process.

20. The process of claim 14, wherein said step of applying a coating comprises chemically depositing a nickel layer on said lower surface, and said process further comprises, after said step of applying a coating, heating said soleplate to a temperature of the order of 230° C. for several hours.

* * * * *